United States Patent
Yasukawa et al.

(10) Patent No.: US 6,268,071 B1
(45) Date of Patent: Jul. 31, 2001

(54) ORGANIC ELECTROLUMINESCENT DEVICE

(75) Inventors: Kouji Yasukawa, Chiba; Hiroyuki Endo, Ibaraki; Hideo Kato; Junichi Shimamura, both of Tokyo; Osamu Onitsuka, Chiba; Akira Ebisawa, Ibaraki, all of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/143,088

(22) Filed: Aug. 28, 1998

(30) Foreign Application Priority Data

Aug. 29, 1997 (JP) .................................... 9-249736
Oct. 27, 1997 (JP) .................................... 9-311455

(51) Int. Cl.$^7$ .................................... H05B 35/04
(52) U.S. Cl. ................ 428/690; 313/504; 313/506; 313/512; 257/99; 257/100; 428/913; 428/917
(58) Field of Search ................... 428/690, 913, 428/917; 313/504, 506, 512; 257/99, 100

(56) References Cited

U.S. PATENT DOCUMENTS 5,909,081 * 6/1999 Eida et al. ................... 313/504

FOREIGN PATENT DOCUMENTS

| 0 859 539 | 8/1998 | (EP) . |
| 3-261091 | 11/1991 | (JP) . |
| 5-36475 | 2/1993 | (JP) . |
| 5-89959 | 4/1993 | (JP) . |
| 8-302340 | 11/1996 | (JP) . |
| 96/25020 | * 8/1996 | (WO) .............................. H05B/33/00 |

OTHER PUBLICATIONS

Technical Information Paper 30Y–296C and partial translation (Nov. 1997).
Technical Information Paper 30Y–296D and partial translation. (no date).

* cited by examiner

*Primary Examiner*—Marie Yamnitzky
*Assistant Examiner*—Dawn L. Garrett
(74) *Attorney, Agent, or Firm*—Oblon, Spivak, McClelland, Maier & Neustadt, P.C.

(57) ABSTRACT

An organic EL device comprises a substrate, an organic EL structure stacked on the substrate, a sealing plate located on the organic EL structure with a predetermined space therebetween, and a sealing adhesive agent for fixing the sealing plate on the substrate and thereby closing up the organic EL structure. The sealing adhesive agent is a photo-curing type adhesive agent which, upon photo-curing, generates gases under heating conditions of 85° C. and 60 minutes. In these gases, the total amount of a low-molecular straight-chain aliphatic hydrocarbon which may have a substituent, an aromatic hydrocarbon which may have a substituent, an alicyclic hydrocarbon which may have a substituent, and a heterocyclic compound and a siloxane which may have a substituent is 200 μg/g or lower calculated as benzene. The organic EL device of the invention is reduced as much as possible in terms of a deterioration with time, and can maintain its initial performance over a long period of time, so that it can have an ever longer service life.

10 Claims, 1 Drawing Sheet

ORGANIC ELECTROLUMINESCENT DEVICE

BACKGROUND OF THE INVENTION

The present invention relates generally to an organic EL (electroluminescent) device using an organic compound, and more specifically to an improvement in or relating to an adhesive agent for fixing a sealing plate in place to protect an organic EL structure stacked on a substrate.

In recent years, organic EL devices have been under intensive investigation. One such device is basically built up of a thin film form of hole transporting material such as triphenyldiamine (TPD) deposited by evaporation on a hole injecting electrode, a light emitting layer of fluorescent material such as an aluminum quinolinol complex ($Alq^3$) laminated thereon, and a metal (electron injecting) electrode of a metal having a low work function such as Mg and formed on the light emitting layer. This organic EL device now attracts attentions because a very high luminance ranging from several hundreds to tens of thousands $cd/m^2$ can be achieved with a voltage of approximately 10 V.

A grave problem with an organic EL device is that it is acutely sensitive to moisture. Exposure of the organic EL device to moisture, for instance, causes a light emitting layer to peel off electrode layers, or materials forming part thereof to degenerate. This results in another problem that non-light emission spots called dark spots occur or any consistent light emission cannot be kept.

One approach known to solve this problem is to fix an airtight case, a sealing layer or the like closely on a substrate to cover an organic EL multilayer structure, thereby shielding it from the outside, as typically disclosed in JP-A's 5-36475, 5-89959 and 7-169567.

Even with the provision of such a sealing layer, however, several problems still arise; as driving time goes by, the light emission luminance decreases or the dark spots occur. If the dark spots become large, then the device will deteriorate and, in the worst case, the device will be unable to work.

OBJECT, AND SUMMARY OF THE INVENTION

The present invention has for its object to provide an organic EL device which, in terms of deterioration with time, is reduced as much as possible so as to have an ever longer service life, so that its initial performance can be maintained over a long period of time.

As a consequence of intensive studies of factors ascribable to a deterioration in an organic EL device, the inventors have found that one leading cause of such a deterioration is the reactions of gases released out of a sealing adhesive agent with structural films of the organic EL device, and so have accomplished the present invention.

The aforesaid object is achieved by the inventions defined below.

(1) An organic electroluminescent device comprising a substrate, an organic EL structure stacked on said substrate, a sealing plate located on said organic EL structure with a predetermined space therebetween, and a sealing adhesive agent for fixing said sealing plate on said substrate and closing up said organic EL structure, wherein:

said sealing adhesive agent is a photo-curing type adhesive agent which, after photo-curing, generates gases under heating conditions of 85° C. and 60 minutes, in which gases a total amount of a low-molecular straight-chain aliphatic hydrocarbon which may have a substituent, an aromatic hydrocarbon which may have a substituent, an alicyclic hydrocarbon which may have a substituent, and a heterocyclic compound which may have a substituent, and a siloxane is 200 μg/g or lower calculated as benzene.

(2) The organic EL device according to (1), wherein said gases generated contain:

propylene carbonate≦25 μg/g calculated as benzene, propylene glycol≦15 μg/g calculated as benzene, and toluene≦20 μg/g calculated as benzene.

(3) The organic EL device according to (1), wherein said gases contains iodobenzene in an amount of at least 1 μg/g calculated as benzene.

(4) The organic EL device according to (1), wherein said adhesive agent is a cation polymerization epoxy adhesive agent of an ultraviolet curing type.

(5) An organic EL device comprising a substrate, an organic EL structure stacked on said substrate, a sealing plate located on said organic EL structure with a given space therebetween, and a sealing adhesive agent for fixing said sealing plate on said substrate and closing up said organic EL structure, wherein:

said sealing adhesive agent is a photo-curing type adhesive agent which, after photo-curing, generates gases under heating conditions of 85° C. and 60 minutes, said gases containing:

propylene carbonate≦25 μg/g calculated as benzene, propylene glycol≦15 μg/g calculated as benzene, and toluene≦20 μg/g calculated as benzene.

(6) The organic EL device according to (5), wherein said gases contains iodobenzene in an amount of at least 1 μg/g calculated as benzene.

DISCLOSURE OF THE INVENTION

Figure 1:
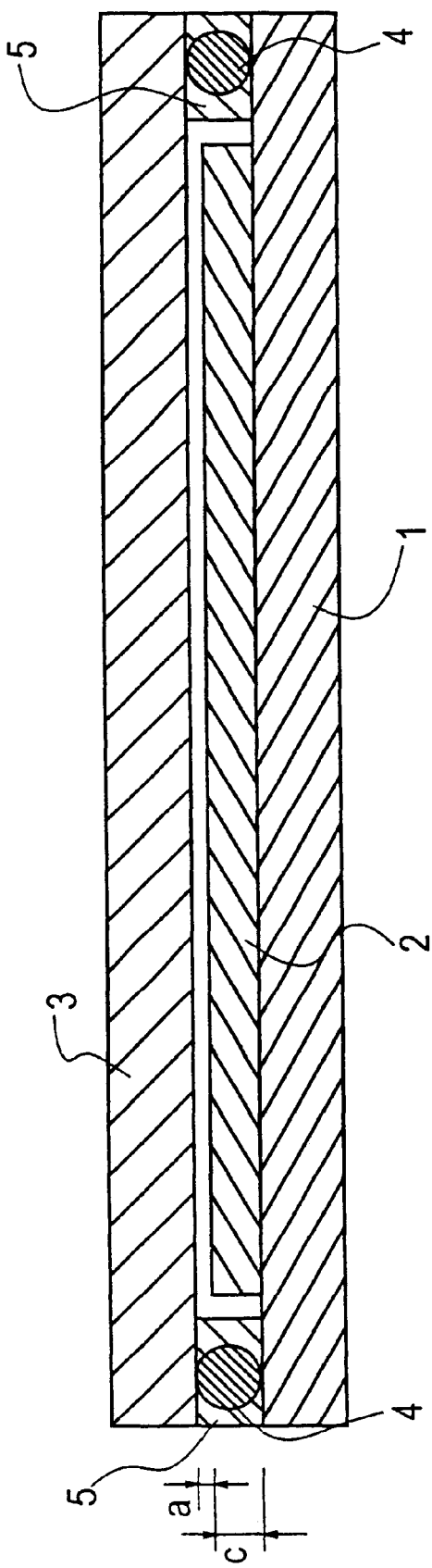
FIG. 1 is a sectional schematic of one embodiment of the organic EL device according to the invention.

The organic EL device of the invention comprises a substrate, an organic EL structure stacked on said substrate, a sealing plate located on said organic EL structure with a predetermined space therebetween, and a sealing adhesive agent for fixing said sealing plate on said substrate and closing up said organic EL structure, wherein said sealing adhesive agent is a photo-curing type adhesive agent which, after photo-curing, generates gases under heating conditions of 85° C. and 60 minutes, in which gases the total amount of a low-molecular straight-chain aliphatic hydrocarbon which may have a substituent, an aromatic hydrocarbon which may have a substituent, an alicyclic hydrocarbon which may have a substituent, and a heterocyclic compound and a siloxane which may have a substituent is 200 μg/g or lower calculated as benzene. By limiting the amount of gases generated from the sealing adhesive agent to the predetermined value or lower, it is thus possible to prevent an attack on the organic EL structure by the gases, thereby preventing a deterioration in the organic EL device.

The gases generated from the sealing adhesive agent are generally broken down into gas species generated before curing and gas species generated after curing. However, the chief concern of the invention is the gas species that are generated after curing and contribute greatly to a deterioration of the organic EL device. The gas species generated after curing, although varying with the types of resin and catalyst used and so not critical to the practice of the invention, include low-molecular straight-chain aliphatic hydrocarbons which may have a substituent, for instance, propylene carbonate, acetone, acrolein, and dichloromethane; aromatic hydrocarbons which may have a substituent, for instance, benzene, iodobenzene, benzaldehyde, acetophenone, methyl phenyl sulfide, and benzoyl chloride; alicyclic hydrocarbons which may have a substituent, for instance, cyclohexanone; heterocyclic compounds which may have a substituent, for instance, γ-butyrolactone; and siloxanes, for instance, cyclic dimethyl siloxanes. These gases appear to be mainly generated through polymerization reactions and be derived from catalysts, etc.

The amount of the gases measured is found per unit gram of sample. In this case, the total amount of the gases calculated as benzene should be 200 μg/g or lower, preferably 150 μg/g or lower, and more preferably 100 μg/g or lower. The lower limit is not critical to the practice of the invention, and so may be 0 μg/g. Usually, however, the lower limit is placed on about 50 μg/g. By the term "amount calculated as benzene" used herein is intended a value calculated as benzene in quantitative analysis, for instance, a value found by working curve calculation for benzene used as a standard sample in quantitative analysis.

It is more preferable to use an adhesive agent which generates as post-curing gases propylene carbonate in an amount of 25 μg/g or lower and preferably 10 μg/g or lower, propylene glycol in an amount of 15 μg/g or lower and preferably 8 μg/g or lower, and toluene in an amount of 20 μg/g or lower and preferably 10 μg/g, all calculated as benzene and per unit gram of sample. These lower limits are preferably below detection limit. Preferably, these post-curing gases contain iodobenzene in an amount of at least 1 μg/g and especially 5 to 70 μg/g. When propylene carbonate, propylene glycol and toluene exceed their upper limits, they react with, and launch an attack on, structural films forming part of the organic EL device, and so make the functions thereof worse, resulting in the occurrence of dark spots. Consequently, the organic EL device degrades with a deterioration in light emission performance. Iodobenzene appears to be derived from reaction initiators. If the amount of each of the gases generated is below the upper limit, it is then acceptable that the total amount of the gases exceeds the aforesaid value. If the amount of iodobenzene generated is within the range as defined above, it is also acceptable that the total amount of the gases exceeds the aforesaid value.

No particular limitation is imposed on qualitative, and quantitative analyses of the gases generated. Ordinary qualitative, and quantitative analyses of gases may be used. For instance, gas chromatography may be used. It is particularly preferable, however, to use a head space gas chromatogram/mass spectrometric analysis method. To make an accelerated estimation of the gases generated, the amount of the gases generated upon held at 85° C. for 60 minutes is measured in the practice of the invention.

For the sealing adhesive agent in the invention, any desired photo-curing type adhesive agent may be used provided that the amounts of the gases generated are within the aforesaid ranges. For instance, use may be made of radical adhesive agents using various acrylate resins such as ester acrylate, urethane acrylate, epoxy acrylate, melamine acrylate, and acrylic resin acrylate, and urethane polyester resin; cationic adhesive agents using resins such as epoxy, and vinyl ether; and thiol.en addition type resin adhesive agents. Among these, preference is given to the cationic adhesive agent because there is no oxygenous obstacle and a polymerization reaction proceeds even after light irradiation.

A preferred example of the cationic adhesive agent is a cation curing epoxy resin adhesive agent of the ultraviolet curing type. Each of the organic layers forming the organic EL structure has a glass transition temperature of usually 140° C. or lower, and especially about 80 to 100° C. For this reason, an ordinary thermosetting type adhesive agent cannot be used with an organic EL device, because its setting temperature is of the order of 140 to 180° C.; the organic EL structure is softened upon the setting of the adhesive agent, resulting in a deterioration in its performance. With an ultraviolet curing type adhesive agent, on the other hand, such a softening problem does not arise. However, a commonly used current ultraviolet curing type adhesive agent is an acrylic adhesive agent which is found to have an adverse influence on structural materials forming the organic EL structure because of the volatilization of the acrylic monomer contained therein during curing. As a consequence, the performance of the organic EL structure suffers deterioration. In the practice of the invention, it is thus preferable to use the aforesaid cation curing type ultraviolet curing epoxy resin adhesive agent which is completely or substantially free of such problems.

Commercially available ultraviolet curing type epoxy resin adhesive agents include a combined ultraviolet and heat curing type epoxy resin adhesive agent. In this case, a radical curing type acrylic resin is often mixed or modified with a heat curing type epoxy resin. In other words, this adhesive agent is not preferable for use with the organic EL display of the invention because the problem incidental to the volatilization of the acrylic monomer in the acrylic resin or the problem in connection with the setting temperature of the thermosetting type resin remains still unsolved.

By the "cation curing type ultraviolet curing epoxy resin adhesive agent" used herein is intended an adhesive agent of the type which contains as a primary curing agent a Lewis acid-base type curing agent subjected to photo-decomposition upon ultraviolet or other light irradiation to release a Lewis acid catalyst, and in which a main component epoxy resin is polymerized and cured through a cation polymerization type reaction mechanism while a Lewis acid generated by light irradiation acts as a catalyst.

The epoxy resin contained as the main component in the aforesaid adhesive agent, for instance, includes an epoxidized olefin resin, an alicyclic epoxy resin, and a novolak epoxy resin. The aforesaid curing agent, for instance, includes a Lewis acid-base of aromatic diazonium, a Lewis acid-base of diallyliodonium, a Lewis acid-base of triallylsulfonium, and a Lewis acid-base of triallylselenium, among which the Lewis acid-base of diallyiodonium is preferred.

The amount of the adhesive agent to be coated is preferably $6 \times 10^{-2}$ to $2 \times 10^{-4}$ g/cm$^2$, and especially $9 \times 10^{-3}$ to $2 \times 10^{-4}$ g/cm$^2$, although varying the size of the organic EL structure stacked on the substrate or the type, structure and the like of a display built up of the organic EL device. The thickness of the adhesive agent layer should usually ensure that the predetermined space is available at the height at which the sealing plate is located, i.e., in the thickness of the organic EL structure stacked on the substrate; it is of the order of usually $5 \times 10^5$ to $1 \times 10^3$ nm, and especially $2 \times 10^4$ to $2 \times 10^3$ nm, although the invention is not particularly limited thereto.

How to estimate the sealing adhesive agent used herein is then explained more specifically. The objective of the invention is to eliminate the influence of the gases generated from the adhesive agent on the organic EL structure. It is thus preferable to estimate the adhesive agent under the same conditions under which an organic EL display is actually used or under conditions close thereto.

For instance, two glass plates are provided, one for the substrate and another for the sealing plate. A given amount of the adhesive agent in an uncured state is coated on one glass plate. Both the glass plates are pressurized at a given pressure while they are ground together to form a thin adhesive agent layer between them. At this time, a spacer of given size is inserted between them to make sure of the thickness of the organic EL structure and the predetermined space. Following this, the adhesive agent is cured using a curing lamp such as a metal halide lamp, after which the glass plates are peeled off to expose the adhesive agent to view. A given amount of the adhesive agent is taken out of the glass plates, accurately weighed, and charged into an analytical vial to prepare a specimen. Finally, gases generated from this specimen are analyzed.

Next, the organic EL device of the invention is explained with reference to FIG. 1.

FIG. 1 is a sectional schematic illustrative of one embodiment of the organic EL device according to the invention. As illustrated, the organic EL device of the invention comprises a substrate 1, an organic EL structure 2 stacked on the substrate 1, a sealing plate 3 located on the organic EL structure 2 with a predetermined space between them, a particulate or fibrous form of spacer 4 inserted in junctions of the sealing plate 3 for keeping the sealing plate 3 at a given distance from the substrate 1, and a sealing adhesive agent 5 for fixing the sealing plate in place and thereby closing up the organic EL structure. As can be seen from FIG. 1, the distance from the upper end of the organic EL device structure to the lower end face of the sealing plate is a height $c$ of the organic EL structure plus a predetermined space $a$.

Next, the organic EL structure forming part of the organic EL device according to the invention is explained. The organic EL structure of the invention comprises on the substrate a hole injecting electrode, an electron injecting electrode, and at least one organic layer interleaved between both the electrodes. Each or the organic layer comprises at least one hole transporting layer and at least one light emitting layer, and is provided thereon with an electron injecting electrode. In addition, a protective electrode may be provided in the form of the uppermost layer. It is to be noted that the hole transporting layer may be dispensed with. The electron injecting electrode in a film form is made up of a metal having a low work function or a compound or alloy thereof by means of evaporation, and sputtering techniques, preferably a sputtering process.

For the hole injecting electrode, it is usually preferable to use a transparent electrode because the organic EL device is designed to take out the emitted light from the substrate side thereof. Such a transparent electrode, for instance, include ITO (tin-doped indium oxide), IZO (zinc-doped indium oxide), ZnO, SnO$_2$, and In$_2$O$_3$, with ITO (tin-doped indium oxide), and IZO (zinc-doped indium oxide) being preferred. Referring to ITO, it is desired that the mixing ratio of SnO$_2$ with respect to In$_2$O$_3$ be in the range of 1 to 20 wt %, and especially 5 to 12 wt %. Referring to IZO, it is again desired that the mixing ratio of ZnO with respect to In$_2$O$_3$ be in the range of 1 to 20 wt %, and especially 5 to 12 wt % or 12 to 32 wt %. Besides, ITO, and IZO may contain an oxide form of Sn, Ti, Pb, etc. in an amount of up to 1 wt % calculated as oxide.

The hole injecting electrode may be formed as by evaporation, but should preferably be formed by a sputtering technique. When a sputtering process is applied to the formation of an ITO or IZO electrode, it is preferable to use a target comprising In$_2$O$_3$ doped with SnO$_2$ or ZnO. An ITO transparent electrode, when formed by the sputtering technique, suffers a lesser light emission luminance change with time, as compared with an electrode formed by evaporation. For the sputtering technique, it is preferable to use DC sputtering. Power input is then preferably in the range of 0.1 to 10 W/cm$^2$, and especially 0.2 to 5 W/cm$^2$. The film forming rate is preferably in the range of 2 to 100 nm/min., and especially 5 to 50 nm/min.

Preferably but no exclusively, an inert gas such as Ar, He, Ne, Kr, and Xe or a mixture of such inert gases is used as the sputtering gas. The sputtering pressure of such gases may usually be of the order of 0.1 to 20 Pa.

The hole injecting electrode may have at least a certain thickness enough for hole injection; that is, it may have a thickness of usually 5 to 500 nm, and especially 10 to 300 nm.

For the material that forms a film form of electron injecting electrode, it is preferable to use a material effective for injection of electrons and having a low work function, e.g., any one of metal elements K, Li, Na, Mg, La, Ce, Ca, Sr, Ba, Al, Ag, In, Sn, Zn, Zr, Cs, Er, Eu, Ga, Hf, Nd, Rb, Sc, Sm, Ta, Y, and Yb, or compounds such as BaO, BaS, CaO, HfC, LbB$_6$, MgO, MoC, NbC, PbS, SrO, TaC, ThC, ThO$_2$, ThS, TiC, TiN, UC, UN, UO$_2$, W$_2$C, Y$_2$O$_3$, ZrC, ZrN, and ZrO$_2$. To improve the stability of the electrode, it is also preferable to use binary or ternary alloy systems containing metal elements. Preferred alloy systems, for instance, are AgMg systems (Ag: 1 to 20 at %), aluminum alloy systems such as Al·Ca (Ca: 0.01 to 20 at %, and especially 5 to 20 at %), Al·In (In: 1 to 10 at %), Al·Li (0.1 at %≦Li<20 at %, and especially 0.3 at %≦Li≦14 at %), and Al·R where R stands for a rare earth element including Y, and Sc, and In·Mg systems (Mg: 50 to 80 at %). Particular preference is given to pure Al, and aluminum alloy systems such as Al·Li (0.4 at %≦Li<6.5 at % or 6.5 at %≦Li≦14 at % or 0.01 at %≦Li≦12 at %), and Al·R (R: 0.1 to 25 at %, and especially 0.5 to 20 at %) because they are unlikely to produce compression stress. Thus, such electron injecting electrode-forming metals or alloys are usually employed as sputtering targets. These metals or alloys have a work function of 4.5 eV or lower. In the practice of the invention, it is particularly preferable to use metals or alloys having a work function of 4.0 eV or lower.

In the electron injecting electrode film formed by the sputtering technique, the atoms or atom groups upon sputtering have a kinetic energy relatively higher than would be obtained with the evaporation technique, so that the adhesion of the electron injecting electrode film to the organic layer at their interface is improved due to a surface migration effect. In addition, an oxide layer is removed in vacuum from the surface of the electrode by pre-sputtering or moisture or oxygen is removed from the organic layer interface, on which they are absorbed, by reverse sputtering to form a clean electrode-organic layer interface or a clean electrode, so that consistent organic EL displays of high quality can be produced. For the target, the alloys having the aforesaid composition range, and pure metals may be used alone or in combination with an additional target comprising a subordinate component or components or with the addition of a subordinate component or components thereto. It is also acceptable to use a mixture of materials having largely varying vapor pressures as the target, because there is only slight a deviation of the composition of the resultant film from the target composition. There is thus no limitation on the material used with the sputtering technique, whereas there are some limitations such as vapor pressure on the evaporation technique. The sputtering technique is additionally advantageous over the evaporation technique in terms of consistent film thickness and quality as well as productivity, because it is unnecessary to feed the raw material over an extended period of time.

The electron injecting electrode formed by the sputtering technique is a film so very dense that the penetration of moisture into the film is much more reduced as compared with a coarse film prepared by evaporation, and so the chemical stability of the film is much more increased. This ensures the production of organic EL devices having an ever longer service life.

Preferably, the sputtering gas pressure during sputtering is in the range of 0.1 to 5 Pa. By regulating the sputtering gas pressure within this range, it is possible to easily obtain an AlLi alloy having an Li concentration in the aforesaid range. By altering the sputtering gas pressure in the aforesaid range during film formation, it is also possible to easily obtain an electron injecting electrode having such an Li concentration gradient as defined above.

For the sputtering gas, use is made of inert gases employed with ordinary sputtering systems. For reactive sputtering, reactive gases such as $N_2$, $H_2$, $O_2$, $C_2H_4$, and $NH_3$ may be used in addition to these gases.

In the practice of the invention, it is possible to use an RF sputtering process using an RF power source or the like as the sputtering technique. In view of the ease with which the film forming rate is controlled, and less damage to the organic EL structure, however, it is preferable to use a DC sputtering process. Power for operating a CD sputtering system is in the range of preferably 0.1 to 10 W/cm$^2$, and especially 0.5 to 7 W/cm$^2$. The film forming rate is preferably in the range of 5 to 100 nm/min., and especially 10 to 50 nm/min.

The thin film form of electron injecting electrode may have at least a certain thickness enough for the injection of electrons, e.g., of at least 1 nm, and preferably at least 3 nm. Thus, a film thickness of the order of 3 to 500 nm is usually preferable although there is no upper limit thereon.

The organic EL display of the invention may preferably have a protective electrode on the electron injecting electrode, i.e., on the side of the electron injecting electrode that faces away from the organic layer. By the provision of the protective electrode, the electron injecting electrode is protected against the air, moisture, etc., so that the degradation of the constituting thin film can be prevented, resulting in the stabilization of electron injection efficiency and an ever greater increase in the service life of the device. The protective electrode has a very low resistance, and so may also function as an interconnecting electrode when the electron injecting electrode has a high resistance. The protective electrode may contain at least one of Al; Al and a transition metal except Ti; Ti; and titanium nitride (TiN). When these are used alone, the protective electrode preferably contains Al in an amount of about 90 to 100 at %, Ti in an amount of about 90 to 100 at %, and TiN in an amount of about 90 to 100 mol %. Two or more of Al, Ti and TiN may be used at any desired mixing ratio. For instance, a mixture of Al and Ti preferably contains Ti in an amount of up to 10 at %. Alternatively, it is acceptable to laminate together laminae each containing a single species. In particular, favorable results are obtained when Al or Al plus transition metal are used as the interconnecting electrode to be described later. TiN, on the other hand, provides a film having a striking sealing effect because of its good corrosion resistance. For TiN, an about 10% deviation from its stoichiometric composition is acceptable. In addition, Al alloys, and transition metal alloys may contain transition metals, especially Sc, Nb, Zr, Hf, Nd, Ta, Cu, Si, Cr, Mo, Mn, Ni, Pd, Pt and W in the total amount of up to 10 at %, especially up to 5 at %, and more especially up to 2 at %. When the protective electrode functions as the interconnecting material, the thin film resistance becomes lower with a decrease in the content of the transition metal.

The protective electrode may have at least a certain thickness enough to make sure of electron injection efficiency and prevent penetration of moisture, oxygen or organic solvents, for instance, of at least 50 nm, preferably at least 100 nm, and especially 100 to 1,000 nm. With too thin a protective electrode layer, neither are the advantages of the invention obtainable, nor is sufficient connection with terminal electrodes obtainable because the ability of the protective electrode layer to cover steps becomes low. When the protective electrode layer is too thick, on the other hand, the growth rate of dark spots becomes high because of an increase in the stress of the protective electrode layer. It is here to be noted that when the protective electrode functions as an interconnecting electrode, its thickness may be usually of the order of 100 to 500 nm so as to make up for the high film resistance of the electron injecting electrode due to its thinness, and that when the protective electrode functions as other interconnecting electrode, its thickness may be of the order of 100 to 300 nm.

Preferably but not exclusively, the total thickness of the electron injecting electrode plus the protective electrode is usually of the order of 100 to 1,000 nm.

In addition to the aforesaid protective electrode, an additional protective film may be formed after the formation of the electrode. The protective film may be formed of either an inorganic material such as SiOx or an organic material such as Teflon, and a chlorine-containing carbon fluoride polymer. The protective film may be either transparent or opaque, and has a thickness of the order of 50 to 1,200 nm. The protective film may be formed either by the aforesaid reactive sputtering process or conventional processes such as general sputtering, evaporation or PECVD.

In the practice of the invention, a sealing plate is located on the organic EL structure in order to prevent oxidation of the organic layers and electrodes therein. The sealing plate for preventing penetration of moisture may be formed by bonding sealing plates such as glass plates using the aforesaid sealing adhesive material. Instead of the glass plates, metal or plastic plates may also be used.

When the sealing plate is fixed in place by means of the adhesive agent, it is acceptable to use a spacer of given size, thereby making sure of the thickness of the organic EL structure, and the predetermined space. Such a spacer may have a thickness corresponding to the thickness of the aforesaid adhesive agent. Preferably, the spacer size is 1,000 to 20,000 nm, and especially about 1,500 to 8,000 nm calculated as a circle diameter. The spacer is preferably made up of glass, and resin such as divinylbenzene. A particulate or fibrous form of spacer is contained in an amount of 0.01 to 30 wt %, and preferably about 0.1 to 5 wt % in the adhesive agent layer.

The organic EL display closed up by the adhesive agent is preferably filled therein with an inert gas such as He, $N_2$, and Ar. The inert gas in this airtightly closed space has preferably a moisture content of 100 ppm or lower, especially 10 ppm or lower, and more especially 1 ppm or lower.

The lower limit to the moisture content is usually about 0.1 ppm although no particular limitation is imposed thereon.

Next, the organic material layers provided in the organic EL display of the invention are explained.

The light emitting layer has functions of injecting holes and electrons, transporting them, and recombining holes and electrons to create excitons. For the light emitting layer, it is preferable to use a relatively electronically neutral compound.

The hole injecting and transporting layer has functions of facilitating injection of holes from the hole injecting electrode, providing stable transportation of holes and blocking electrons, and the electron injecting and transporting layer has functions of facilitating injection of electrons from the cathode, providing stable transportation for increasing the number of holes and electrons injected into the light emitting layer and confining holes and electrons therein for optimizing the recombination region to improve light emission efficiency The thickness of the light emitting layer, the hole injecting and transporting layer, and the electron injecting and transporting layer is not critical and varies with a particular formation technique although it is usually of the order of preferably 5 to 500 nm, and especially 10 to 300 nm.

The thickness of the hole injecting and transporting layers, and the electron injecting and transporting layer is equal to, or about 1/10 times to about 10 times as large as the thickness of the light emitting layer although it depends on the design of the recombination/light emitting region. When the electron or hole injecting and transporting layer is separated into an injecting layer and a transporting layer, it is preferable that the injecting layer is at least 1 nm thick and the transporting layer is at least 1 nm thick. The upper limit on thickness is usually about 500 nm for the injecting layer and about 500 nm for the transporting layer. The same film thickness applies when two injecting and transporting layers are provided.

In the organic EL display according to the invention, the light emitting layer contains a fluorescent material that is a compound capable of emitting light. The fluorescent material used herein, for instance, may be at least one compound selected from compounds such as those disclosed in JP-A 63-264692, e.g., quinacridone, rubrene, and styryl dyes. Use may also be made of quinoline derivatives such as metal complex dyes containing 8-quinolinol or its derivative as ligands, for instance, tris(8-quinolinolato)aluminum, tetraphenylbutadiene, anthracene, perylene, coronene, and 12-phthaloperinone derivatives. Use may further be made of phenylanthracene derivatives disclosed in JP-A 8-12600 (Japanese Patent Application No. 6-110569), and tetraarylethene derivatives disclosed in JP-A 8-12969 (Japanese Patent Application No. 6-114456).

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by weight, and especially 0.1 to 5% by weight. By using the fluorescent compound in combination with the host substance, it is possible to vary the wavelength performance of light emission, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-A's 63-264692, 3-255190, 5-70733, 5-258859, 6-215874, etc.

Exemplary aluminum complexes include tris(8-quinolinolato)aluminum, bis(8-quinolinolato)magnesium, bis (benzo{f}-8-quinolinolato) zinc, bis (2-methyl-8-quinolinolato)aluminum oxide, tris(8-quinolinolato)indium, tris(5-methyl-8-quinolinolato)aluminum, 8-quinolinolato-lithium, tris(5-chloro-8-quinolinolato)gallium, bis(5-chloro-8-quinolinolato)calcium, 5,7-dichloro-8-quinolinolato-aluminum, tris(5,7-dibromo-8-hydroxyquinolinolato) aluminum, and poly[zinc(II)-bis(8-hydroxy-5-quinolinyl) methane].

Use may also be made of aluminum complexes containing other ligands in addition to 8-quinolinol or its derivatives, for instance, bis(2-methyl-8-quinolinolato) (phenolato) aluminum (III), bis(2-methyl-8-quinolinolato) (o-cresolato) aluminum (III), bis(2-methyl-8-quinolinolato) (m-cresolato) aluminum (III), bis(2-methyl-8-quinolinolato) (p-cresolato) aluminum (III), bis(2-methyl-8-quinolinolato) (o-phenylphenolato)aluminum (III), bis(2-methyl-8-quinolinolato) (m-phenylphenolato)aluminum (III), bis(2-methyl-8-quinolinolato)(p-phenylphenolato)aluminum (III), bis(2-methyl-8-quinolinolato)(2,3-dimethylphenolato)aluminum (III), bis(2-methyl-8-quinolinolato)(2,6-dimethylphenolato) aluminum (III), bis(2-methyl-8-quinolinolato)(3,4-dimethylphenolato)aluminum (III), bis(2-methyl-8-quinolinolato)(3,5-dimethyl-phenolato)aluminum (III), bis (2-methyl-8-quinolinolato)(3,5-di-tert-butylphenolato) aluminum (III), bis(2-methyl-8-quinolinolato)(2,6-diphenylphenolato)aluminum (III), bis(2-methyl-8-quinolinolato)(2,4,6-triphenylphenolato)aluminum (III), bis(2-methyl-8-quinolinolato)(2,3,6-trimethyl-phenolato) aluminum (III), bis(2-methyl-8-quinolinolato)(2,3,5,6-tetramethylphenolato)aluminum (III), bis(2-methyl-8-quinolinolato) (1-naphtholato)aluminum (III), bis(2-methyl-8-quinolinolato)(2-naphtholato)aluminum (III), bis(2,4-dimethyl-8-quinolinolato)(o-phenylphenolato)aluminum (III), bis(2,4-dimethyl-8-quinolinolato)(p-phenylphenolato) aluminum (III), bis(2,4-dimethyl-8-quinolinolato)(m-phenylphenolato)aluminum (III), bis(2,4-dimethyl-8-quinolinolato)(3,5-dimethylphenolato)aluminum (III), bis (2,4-dimethyl-8-quinolinolato)(3,5-di-tert-butylphenolato) aluminum (III), bis(2-methyl-4-ethyl-8-quinolinolato)(p-cresolato)aluminum (III), bis(2-methyl-4-methoxy-8-quinolinolato)(p-phenyl-phenolato)aluminum (III), bis(2-methyl-5-cyano-8-quinolinolato)(o-cresolato)aluminum (III), and bis(2-methyl-6-trifluoromethyl-8-quinolinolato) (2-naphtholato)aluminum (III).

Besides, use may be made of bis(2-methyl-8-quinolinolato)aluminum (III)-$\mu$-oxo-bis(2-methyl-8-quinolinolato)aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum (III)-$\mu$-oxo-bis(4-ethyl-2-methyl-8-quinolinolato)aluminum (III), bis(2-methyl-4-methoxyquinolinolato)aluminum (III)-$\mu$-oxo-bis(2-methyl-4-methoxyquinolinolato)aluminum (III), bis(5-cyano-2-methyl-8-quinolinolato)aluminum (III)-$\mu$-oxo-bis(5-cyano-2-methyl -8-quinolinolato)aluminum (III), bis(2-methyl-5-trifluoromethyl-8-quinolinolato)aluminum (III)-$\mu$-oxo-bis (2-methyl-5-trifluoromethyl-8-quinolinolato)aluminum (III), etc.

Other preferable host substances include phenylanthracene derivatives disclosed in JP-A 8-12600 (Japanese Patent Application No. 6-110569), tetraarylethene derivatives disclosed in JP-A 8-12969 (Japanese Patent Application No. 6-114456), etc.

In the practice of the invention, the light emitting layer may also serve as an electron injecting and transporting layer. In this case, it is preferable to use a fluorescent material, e.g., tris(8-quinolinolato)aluminum or the like, which may be provided by evaporation.

If necessary or preferably, the light emitting layer is formed of a mixed layer of at least one compound capable of injecting and transporting holes with at least one compound capable of injecting and transporting electrons. Preferably in this case, a dopant is incorporated in the mixed layer. The content of the dopant compound in the mixed layer is in the range of preferably 0.01 to 20% by weight, and especially 0.1 to 15% by weight.

In the mixed layer with a hopping conduction path available for carriers, each carrier migrates in the polarly prevailing substance, so making the injection of carriers having an opposite polarity unlikely to occur. This leads to an increase in the service life of the device due to less damage to the organic compound. By incorporating the aforesaid dopant in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons, as will be described later. Especially for the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

For the compounds capable of injecting and transporting electrons, it is preferable to use metal complexes containing quinoline derivatives, especially 8-quinolinol or its derivatives as ligands, in particular, tris(8-quinolinolato) aluminum ($Alq^3$). It is also preferable to use the aforesaid phenylanthracene derivatives, and tetraarylethene derivatives.

For the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

In this case, the ratio of mixing the compound capable of injecting and transporting holes with the compound capable of injecting and transporting electrons is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, particularly 10/90 to 90/10, and more particularly 20/80 to 80/20.

The thickness of the mixed layer must correspond to the thickness of a single molecular layer, and so is preferably less than the thickness of the organic compound layer. More specifically, the mixed layer has a thickness of preferably 1 to 85 nm, especially 5 to 60 nm, and more especially 5 to 50 nm.

Preferably, the mixed layer is formed by co-evaporation where the selected compounds are evaporated from different evaporation sources. When the compounds to be mixed have identical or slightly different vapor pressures (evaporation temperatures), however, they may have previously been mixed together in the same evaporation boat for the subsequent evaporation. Preferably, the compounds are uniformly mixed together in the mixed layer. However, the compounds in an archipelagic form may be present in the mixed layer. The light emitting layer may generally be formed at a given thickness by the evaporation of the organic fluorescent substance or coating a dispersion of the organic fluorescent substance in a resin binder.

For the hole injecting and transporting layer, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyl-diamine (TPD)), aromatic tertiary amines, hydrazone derivatives, carbazole derivatives, triazole derivatives, imidazole derivatives, oxadiazole derivatives having an amino group, and polythiophenes. Where these compounds are used in combination of two or more, they may be stacked as separate layers, or otherwise mixed.

When the hole injecting and transporting layer is provided as a separate hole injecting layer and a separate hole transporting layer, two or more compounds are selected in a preferable combination from the compounds already mentioned for the hole injecting and transporting layer. In this regard, it is preferred to laminate layers in such an order that a compound layer having a lower ionization potential is disposed nearest to the hole injecting electrode (ITO, etc.). It is also preferred to use a compound having good thin film forming ability at the surface of the hole injecting electrode. This order of lamination holds for the provision of two or more hole injecting and transporting layers, and is effective as well for lowering driving voltage and preventing the occurrence of current leakage and the appearance and growth of dark spots. Since evaporation is utilized in the manufacture of devices, films as thin as about 1 to 10 nm can be formed in a uniform and pinhole-free state, which restrains any change in color tone of light emission and a drop of efficiency by re-absorption even if a compound having a low ionization potential and absorption in the visible range is used in the hole injecting layer. Like the light emitting layer and so on, the hole injecting and transporting layer or layers may be formed by evaporating the aforesaid compounds.

For the electron injecting and transporting layer which is provided if necessary, there may be used quinoline derivatives such as organic metal complexes containing 8-quinolinol or its derivatives as ligands, for instance, tris (8-quinolinolato)aluminum ($Alq^3$), oxadiazole derivatives, perylene derivatives, pyridine derivatives, pyrimidine derivatives, quinoxaline derivative, diphenylquinone derivatives, and nitro-substituted fluorene derivatives. The electron injecting and transporting layer may also serve as a light emitting layer. In this case, it is preferable to use tris(8-quinolilato)aluminum, etc. As is the case with the light emitting layer, the electron injecting and transporting layer may then be formed by evaporation or the like.

Where the electron injecting and transporting layer is a double-layered structure comprising an electron injecting layer and an electron transporting layer, two or more compounds are selected in a preferably combination from the compounds commonly used for electron injecting and transporting layers. In this regard, it is preferred to laminate layers in such an order that a compound layer having a greater electron affinity is disposed nearest to the electron injecting electrode. This order of lamination also applies where a plurality of electron injecting and transporting layers are provided.

The substrate may be provided with a color filter film, fluorescent material-containing color conversion film or dielectric reflecting film for controlling the color of light emission.

For the color filter film, a color filter employed with liquid crystal display devices may be used. However, it is preferable to control the properties of the color filter in conformity to the light emitted from the organic EL device, thereby optimizing the efficiency of taking out light emission and color purity.

By using a color filter capable of cutting off extraneous light of such short wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, and especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. It is also preferable to use a material that is not damaged during ITO or IZO film formation.

The light absorbing material is used when light is not fully absorbed by the fluorescent material, and so may be dispensed with, if not required. For the light absorbing material, it is preferable to make a selection from materials that do not extinguish fluorescence.

To form the hole injecting and transporting layer, the light emitting layer and the electron injecting and transporting layer, it is preferable to use a vacuum evaporation technique which enables a homogeneous thin film to be obtained. According to the vacuum evaporation process, it is possible to obtain homogeneous thin films in an amorphous state or with a crystal grain diameter of at most 0.1 $\mu$m. The use of a thin film having a crystal grain diameter exceeding 0.1 $\mu$m results in non-uniform light emission. To avoid this, it is required to increase the driving voltage of the device; however, there is a striking drop of charge injection efficiency.

No particular limitation is imposed on vacuum evaporation conditions. However, an evaporation rate of the order of 0.01 to 1 nm/sec. is preferably applied at a degree of vacuum of $10^{-4}$ Pa or lower. It is also preferable to form the layers continuously in vacuum. If the layers are continuously formed in vacuum, high properties are then obtained because the adsorption of impurities on the interface between the adjacent layers can be avoided. Furthermore, the driving voltage of the device can be lowered while the growth and occurrence of dark spots are inhibited.

When the vacuum evaporation process is used to form the layers, each containing a plurality of compounds, it is preferable to carry out co-evaporation while boats charged with the compounds are individually placed under temperature control.

The organic EL display of the invention is generally of the DC drive type while it may be of the AC or pulse drive type. The applied voltage is generally of the order of 2 to 30 V, and especially 2 to 20 volts.

EXAMPLE

The present invention are explained more specifically with reference to some experiments and examples.

Experiment 1

A commercially available ultraviolet curing type epoxy resin adhesive agent 30Y296D (100 mg, made by Three Bond) in an uncured state was coated on a substrate of glass 7059 (made by Corning). Another glass 7059 (Corning) serving as a sealing plate was put over the substrate. Then, they were pressurized at a pressure of 3 kg/cm$^2$ while they were ground together, thereby forming a thin adhesive agent layer between the glass substrate and the glass sealing plate. At this time, 7 $\mu$m spacers (1 wt %) were dispersed in the adhesive agent to obtain an adhesive agent layer of 7 $\mu$m in thickness. Then, the adhesive agent surface was irradiated through the glass substrate with ultraviolet light from a metal halide lamp and in an integral light quantity of 600 mJ, thereby curing the adhesive agent. After curing, the sealing plate was peeled off the glass substrate to expose the bonded surface to view, from which the adhesive agent (about 50 mg) was scratched off. The thus obtained sample was accurately weighed, and charged into an analytical vial, which was in turn placed as a head space in a thermostat. In addition, a tube was connected to a vial opening for introducing a sample gas into a gas chromatograph.

The sample was analyzed by means of a head space gas chromatograph/mass spectrometric analysis method (HS-GC-MS method). For an analyzer use was made of Analyzer 5970B (made by Hewlett-Packard). The gases generated were analyzed under measuring conditions where the head space thermostat was held at 85° C. for 60 minutes. At this time, the loop temperature from the vial to a sample inlet in the gas chromatograph was set at 150° C. For a gas chromatograph column use was made of HP-WAX (0.2 mm×25 m) at a column temperature of 40 to 230° C. (10° C./min.). A helium gas was used for a carrier gas at 13 psi (0.5 ml/min.). The helium gas (2%) was introduced into the column at a sample inlet injection temperature of 250° C. and a sample split ratio of 50. Mass spectrometric analysis conditions were M/Z=35 to 550 (mass monitor) and a detector temperature of 280° C.

Qualitative analysis was carried out on the basis of a TIC holding time and mass spectra, and quantitative analysis was performed by working curve calculation for a standard sample benzene. The obtained results are given in Table 1.

TABLE 1

| Component | Holding Time (min.) | Mass Spectra (m/Z) | Qualitative Results | Amount ($\mu$g/g) |
|---|---|---|---|---|
| A | 2.2 | 58, 4.3 | Acetone | 2 |
| H | 2.4 | 56, 55, 53, 37 | Acrolein | 8 |
| B | 3.1 | | Dichloromethane | 4* |
| I | 3.1 | 59, 45, 39 | Undetected | 4* |
| J | 3.2 | 281, 207, 73 | Cyclic Dimethyl-siloxane | 13* |
| C | 3.3 | 78, 73, 63 | Benzene | 13* |
| K | 5.1 | 355, 267, 207, 193, 73 | Cyclic Dimethyl-siloxane | 4 |
| L | 8.4 | 98, 83, 80, 69, 55, 42 | Dichlorohexane | 23 |
| D | 11.7 | 204, 152, 127, 77, 51 | Iodobenzene | 63* |
| M | 11.7 | 106, 105, 77, 51 | Benzoyl chloride (presumed) | 63* |
| Total | | | | 118 |

4* means the total amount of gases generated from components B and I.
13* means the total amount of gases generated from components J and C.
63* means the total amount of gases generated from components D and M.

As can be seen from Table 1, the total amount of gases generated from the inventive adhesive agent sample after ultraviolet curing is a small value of 118 $\mu$g/g calculated as benzene.

Experiment 2

A sample was analyzed as in Experiment 1 with the exception that an adhesive agent containing a metallocene compound as a reaction initiator was used for a comparative adhesive agent sample. As a result, the total amount of gases generated from the comparative adhesive agent sample after ultraviolet curing was a very large value of 217 $\mu$g/g.

Example 1

An organic EL device was prepared using the inventive sample employed in Experiment 1.

A glass substrate was provided thereon with an 85 nm-thick ITO transparent electrode (hole injecting electrode) in such a way that pixels (280×280 $\mu$m per pixel) were patterned on the ITO transparent electrode according to an array of 64 dots×7 lines. Then, the substrate with the patterned hole injecting electrode formed on it was ultrasonically washed with neutral detergent, acetone, and ethanol, and then pulled up from boiling ethanol, followed by drying. The substrate was subsequently cleaned on its surface with UV/O$_3$. Then, the substrate was fixed to a substrate holder in a vacuum evaporation system, which was evacuated to a vacuum of 1×10$^{-4}$ Pa or lower. 4,4',4"-tris(-N-(3-methylphenyl)-N-phenylamino)triphenylamine (m-MTDATA) was deposited by evaporation at a deposition rate of 0.2 nm/sec. to a thickness of 40 nm, thereby forming a hole injecting layer. With the vacuum still maintained, N,N'-diphenyl-N,N'-m-tolyl-4,4'-diamino-1,1'-biphenyl (TPD) was then deposited by evaporation at a deposition rate of 0.2 nm/sec. to a thickness of 35 nm, thereby forming a hole transporting layer. With the vacuum still kept, tris(8-quinolinolato)aluminum (Alq$^3$) was deposited by evaporation at a deposition rate of 0.2 nm/sec. to a thickness of 50 nm, thereby forming a combined electron injecting/transporting and light emitting layer. With the vacuum still kept, MgAg was deposited by co-evaporation at an evaporation rate ratio of Mg:Ag=1:10 to a thickness of 200 nm, thereby forming an electron injecting layer. With the vacuum still maintained, this EL device substrate was transferred to a sputtering system where an Al protective film of 200 nm in thickness was formed at a sputtering pressure of 0.3 Pa by means of a DC sputtering process using an Al target. Ar was used for the sputtering gas, with a power input of 500 W, a target diameter of 4 inches, and a substrate-target distance of 90 mm. Finally, the adhesive agent of the invention and a spacer of 7 $\mu$m in diameter were used to bond the glass sealing plate used in Experiment 1 to the substrate and thereby close up an organic EL structure.

In the air atmosphere, a DC voltage was applied on the thus obtained organic EL device to drive it at a constant current density of 10 mA/cm$^2$. In the initial state, no dark spot was found at all. The organic EL device was stored under accelerated conditions of a temperature 60° C. and a humidity of 95% for 100 hours, and for 500 hours. Then, the device was driven under the same conditions to make estimation of dark spots.

Referring to the inventive sample, no dark spot of 50 $\mu$m or smaller in diameter was found in the 64×7=448 pixels after 100-hour storage, and one to five dark spots of 100 $\mu$m or smaller in diameter were found after 500-hour storage.

Comparative Example 1

An organic EL device was obtained as in Example 1 with the exception that the comparative sample used in Experiment 2 was used as the adhesive agent, and estimated as in Example 1. Consequently, no dark spot of 50 $\mu$m or smaller in diameter was found at all after 100-hour storage. However, 10 to 15 dark spots of 100 $\mu$m or smaller in diameter were found after 500-hour storage.

Example 2

Samples 1 to 5 prepared from a commercially available ultraviolet curing type epoxy resin adhesive agent were estimated and quantitatively analyzed as in Example 1. The obtained results are given in Table 2.

TABLE 2

Amounts of Gas Components Generated from Samples ($\mu$g/g)

| Gas Components | Sample Nos. | | | | |
|---|---|---|---|---|---|
| | 1 | 2 | 3 | 4 | 5 |
| Cyclohexanone | 20 | 2 | — | — | — |
| Iodobenzene | 13 | 63 | 8 | — | — |
| Benzaldehyde | 9 | — | — | — | — |
| Propylene carbonate | — | — | — | 32* | 23 |
| Acrolein | 6 | 8 | 9 | 7 | 3 |
| Propylene glycol | — | — | — | 6 | 12 |
| Acetone | — | 2 | — | — | — |
| $\gamma$-butyrolactone | — | — | — | — | — |
| Methyl phenyl sulfide | — | — | — | — | — |
| Toluene | — | — | — | 22* | — |
| Propynyl benzene | — | — | — | — | — |
| Dichloromethane | 7 | 4 | 2 | — | — |
| Benzene | 8 | 13 | 4 | — | — |
| Acetophenone | 3 | — | — | — | — |
| Total (including other components) | 65 | 118 | 23 | 80 | 39 |

*Departures from the preferred range

As can be seen from Table 2, the amounts of gases generated from the inventive samples after ultraviolet curing are propylene carbonate $\leq$ 30 $\mu$g/g,
propylene glycol $\leq$ 20 $\mu$g/g, and
toluene $\leq$ 20 $\mu$g/g all calculated as benzene.

A glass substrate was provided thereon with an 85 nm-thick ITO transparent electrode (hole injecting electrode) in such a way that pixels (280×280 μm per pixel) were patterned on the ITO transparent electrode according to an array of 64 dots×7 lines. Then, the substrate with the patterned hole injecting electrode formed on it was ultrasonically washed with neutral detergent, acetone, and ethanol, and then pulled up from boiling ethanol, followed by drying. The substrate was subsequently cleaned on its surface with $UV/O_3$. Then, the substrate was fixed to a substrate holder in a vacuum evaporation system, which was evacuated to a vacuum of $1×10^{-4}$ Pa or lower. 4,4',4"-tris(-N-(3-methylphenyl)-N-phenylamino)triphenylamine (m-MTDATA) was deposited by evaporation at a deposition rate of 0.2 nm/sec. to a thickness of 40 nm, thereby forming a hole injecting layer. With the vacuum still maintained, N,N'-diphenyl-N,N'-m-tolyl-4,4'-diamino-1,1'-biphenyl (TPD) was then deposited by evaporation at a deposition rate of 0.2 nm/sec. to a thickness of 35 nm, thereby forming a hole transporting layer. With the vacuum still kept, tris(8-quinolinolato)aluminum ($Alq_3$) was deposited by evaporation at a deposition rate of 0.2 nm/sec. to a thickness of 50 nm, thereby forming a combined electron injecting/transporting and light emitting layer. With the vacuum still kept, MgAg was deposited by co-evaporation at an evaporation rate ratio of Mg:Ag=1:10 to a thickness of 200 nm, thereby forming an electron injecting layer. With the vacuum still maintained, this EL device substrate was transferred to a sputtering system where an Al protective film of 200 nm in thickness was formed at a sputtering pressure of 0.3 Pa by means of a DC sputtering process using an Al target. Ar was used for the sputtering gas, with a power input of 500 W, a target diameter of 4 inches, and a substrate-target distance of 90 mm. Finally, the aforesaid adhesive agent samples 1 to 5 and a spacer of 7 μm in diameter were used to bond such a glass sealing plate as mentioned above to the substrate and thereby close up an organic EL structure.

In the air atmosphere, a DC voltage was applied on the thus obtained organic EL display samples to drive them at a constant current density of 10 mA/cm². Some samples were heat treated at 85° C. for 1 hour, and some samples were not. In the initial state, the occurrence of dark spots, and the size of dark spots, if occurred, were estimated. Then, the samples were driven under the same conditions after they had been stored under accelerated conditions of a temperature 60° C. and a humidity of 95%. In this case, too, the occurrence of dark spots, and the size of dark spots, if occurred, were estimated. The results are given in Table 3. For the estimation of dark spots, a dark spot having the greatest diameter was selected from those occurring on four light emitting surfaces per device, and the diameters of dark spots per four devices were averaged.

TABLE 3

| | Dark Spot Diameter (μm) | | | |
|---|---|---|---|---|
| | Initial State | | After Storage Test | |
| Sample No. | No Heat Treatment | Heat Treatment | No Heat Treatment | Heat Treatment |
| 1 | not found | not found | 50 | 75 |
| 2 | not found | not found | 50 | 100 |
| 3 | not found | not found | 50 | 75 |
| 4* | not found | not found | 150 | 300 |
| 5 | not found | not found | 100 | 150 |

*shows departures from the preferred range

As can be seen from the table, the inventive samples showed no dark spot at all in the initial state. Even after storage testing, the diameter of dark spots occurred in the samples which were not heat treated is within an acceptable range. It is to be noted that dark spots of 100 μm or smaller in diameter are within an allowable range.

The samples which were heat treated showed a dark spot having a large diameter after storage testing, but they were found to have an improved initial luminance and an increased half life of luminance as well. This teaches that it is desired that whether or not the heat treatment is to be carried out be determined while taking overall properties into account.

What we claim is:

1. An organic electroluminescent device comprising a substrate, an organic EL structure stacked on said substrate, a sealing plate located on said organic EL structure with a predetermined space therebetween, and a sealing adhesive agent for fixing said sealing plate on said substrate and closing up said organic EL structure, wherein:

said sealing adhesive agent is a photo-curing type adhesive agent which, after photo-curing, generates gases under heating conditions of 85° C. and 60 minutes, in which gases a total amount of a low-molecular straight-chain aliphatic hydrocarbon which may have a substituent, an aromatic hydrocarbon which may have a substituent, an alicyclic hydrocarbon which may have a substituent, and a heterocyclic compound which may have a substituent, and a siloxane is 200 μg/g or lower calculated as benzene.

2. The organic electroluminescent device according to claim 1, wherein said gases generated contain:

propylene carbonate≦25 μg/g calculated as benzene,
propylene glycol≦15 μg/g calculated as benzene, and
toluene≦20 μg/g calculated as benzene.

3. The organic electroluminescent device according to claim 1, wherein said gases contains iodobenzene in an amount of at least 1 μg/g calculated as benzene.

4. The organic electroluminescent device according to claim 1, wherein said adhesive agent is a cation polymerization epoxy adhesive agent of an ultraviolet curing type.

5. An organic electroluminescent device comprising a substrate, an organic EL structure stacked on said substrate, a sealing plate located on said organic EL structure with a given space therebetween, and a sealing adhesive agent for fixing said sealing plate on said substrate and closing up said organic EL structure, wherein:

said sealing adhesive agent is a photo-curing type adhesive agent which, after photo-curing, generates gases under heating conditions of 85° C. and 60 minutes, said gases containing:

propylene carbonate≦25 μg/g calculated as benzene,
propylene glycol≦15 μg/g calculated as benzene, and
toluene≦20 μg/g calculated as benzene.

6. The organic electroluminescent device according to claim 5, wherein said gases contains iodobenzene in an amount of at least 1 μg/g calculated as benzene.

7. An organic electroluminescent device comprising a substrate, an organic EL structure stacked on said substrate, a sealing plate located on said organic EL structure with a predetermined space therebetween, and a sealing adhesive agent for fixing said sealing plate on said substrate and closing up said organic EL structure, wherein:

said sealing adhesive agent is a photo-curing type adhesive agent which, after photo-curing, generates gases under heating conditions of 85° C. and 60 minutes, in which gases a total amount of a low-molecular straight-chain aliphatic hydrocarbon which may have a substituent, an aromatic hydrocarbon which may have a substituent, an alicyclic hydrocarbon which may have a substituent, and a heterocyclic compound which may have a substituent, and a siloxane is 200 µg/g or lower calculated as benzene, wherein fluorescent material present in said device is confined to said organic EL structure.

8. An organic electroluminescent device comprising a substrate, an organic EL structure stacked on said substrate, a sealing plate located on said organic EL structure with a give space therebetween, and a sealing adhesive agent for fixing said sealing plate on said substrate and closing up said organic EL structure, wherein:

said sealing adhesive agent is a photo-curing type adhesive agent which, after photo-curing, generates gases under heating conditions of 85° C. and 60 minutes, said gases containing:

propylene carbonate≦25 µg/g calculated as benzene, propylene glycol≦20 µg/g calculated as benzene, wherein fluorescent material present in said device is confined to said organic EL structure.

9. The organic electroluminescent device according to claim 1, wherein said total amount of gases is no lower than about 50 µg/g calculated as benzene.

10. The organic electroluminescent device according to claim 5, wherein said total amount of gases is no lower than about 50 µg/g calculated as benzene.

* * * * *